United States Patent [19]

Storar

[11] Patent Number: 5,404,108
[45] Date of Patent: Apr. 4, 1995

[54] METHOD AND APPARATUS FOR TESTING ELECTRIC MOTOR ROTORS

[75] Inventor: Robert C. Storar, Dayton, Ohio

[73] Assignee: Automation Technology, Inc., Dayton, Ohio

[21] Appl. No.: 22,551

[22] Filed: Feb. 25, 1993

[51] Int. Cl.$^6$ ............... G01R 31/02; G01L 3/26
[52] U.S. Cl. .................... 324/546; 324/772; 318/490; 73/116
[58] Field of Search ............ 324/158 MG, 545, 772; 318/490, 696; 73/116; 340/648; 361/23, 31

[56] References Cited

U.S. PATENT DOCUMENTS

| | | | |
|---|---|---|---|
| 3,068,385 | 12/1962 | Galbraith | 324/772 |
| 3,898,560 | 8/1975 | Farreras et al. | 324/772 |
| 4,099,163 | 7/1978 | Seeger et al. | 318/490 |
| 4,743,848 | 5/1988 | Krimm et al. | 324/772 |
| 4,777,446 | 10/1988 | Santandrea et al. | 324/772 |
| 4,991,429 | 2/1991 | Stacey et al. | 324/158 MG |
| 5,030,917 | 7/1991 | Kliman | 324/772 |
| 5,032,826 | 7/1991 | Miller et al. | 324/545 |
| 5,059,878 | 10/1991 | Bardelang et al. | 318/490 |
| 5,218,860 | 6/1993 | Storar | 73/116 |

*Primary Examiner*—Maura K. Regan
*Attorney, Agent, or Firm*—Biebel & French

[57] ABSTRACT

A testing apparatus for rotors of electric motors comprising a test fixture including a fixture shaft on which a rotor is temporarily attached to a known inertial load. A stator creates a rotating magnetic field to cause rotation of the rotor, and an encoder senses the amount of angular rotation of the rotor in short time intervals, which is recorded in a memory and later used to calculate torque. An index mark from the encoder indicates each complete revolution of the rotor and may be used to determine the location of a defective rotor segment by reference to a start point mark placed on the rotor prior to the test. An electronic control circuit initially applies a low value electric current to the stator to create a rotating magnetic field to cause the rotor to rotate at a slower than normal rate to improve the resolution of the torque measurement. After the rotor has accelerated to a predetermined value, the stator voltage may be increased. The amount of actual rotation of the rotor at multiple, known time intervals as the rotor accelerates to a predetermined speed is used to calculate actual torque.

7 Claims, 6 Drawing Sheets

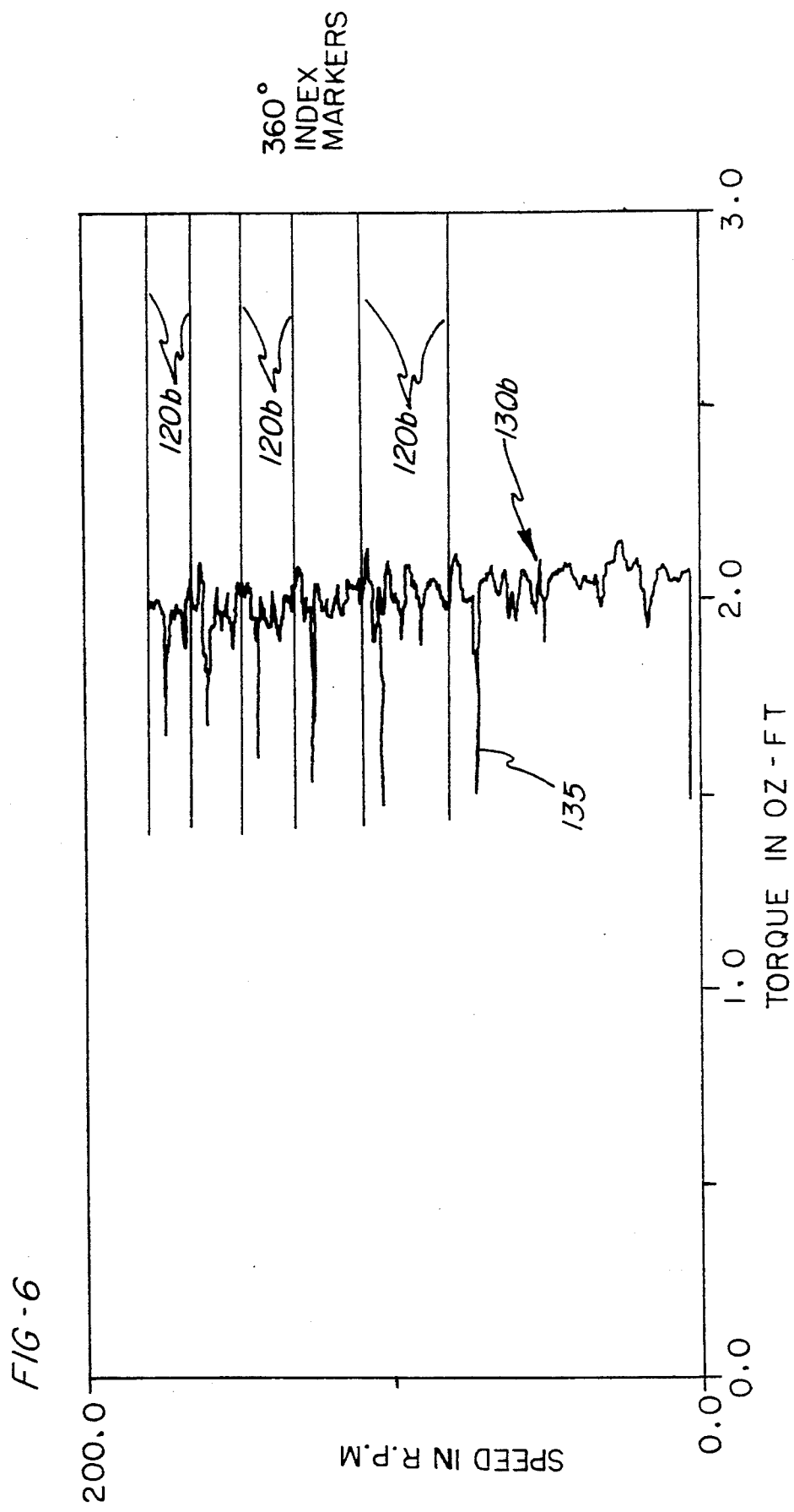

METHOD AND APPARATUS FOR TESTING ELECTRIC MOTOR ROTORS

BACKGROUND OF THE INVENTION

This invention relates to a method and apparatus for testing electric motor rotors, particularly the rotors of induction motors.

Rotors may be described as follows: the rotor is formed from laminated electrical steel punchings, and the rotor winding consists of bars contained in slots punched in the laminations. These bars are short-circuited at both ends by a short-circuiting ring. A bar-end ring structure, without the laminated core, is called a squirrel cage. In small—and medium—horsepower sizes, rotors are made by casting aluminum into the rotor core. In larger sizes of AC motors, cast-aluminum rotors are not practical, and copper bars are inserted into the rotor slots. These copper bars are short-circuited at both ends by a copper end ring, and the end ring is brazed or soldered onto the bars. Sometimes bronze or other alloys are used to replace copper in making the cage and end ring. The size at which the transition between cast-aluminum and copper rotor takes place varies among motor manufacturers, but virtually all rotors in motor sizes of several thousand horsepower and above are built with bar-type rotors.

Rotors are not often tested, but some rotor manufacturing problems can cause poor motor performance. High porosity of an aluminum winding can cause poor current flow, thus limiting torque. Voids in the aluminum winding that develop during the casting process can cause an open circuit at that position on the rotor. Sticking of the aluminum to the steel core can shunt current through the lamination, which reduces motor torque. Other manufacturing processes can create non-uniform air gaps, magnetic imbalance and other problems.

It would be desirable to test each rotor to determine that the completed motor will perform at its rated output, and further, to determine whether there might be a pattern in the performance of a set of rotors indicating a problem in the manufacturing process.

SUMMARY OF THE INVENTION

With the present invention, each rotor placed in an electric motor can be checked for proper operation before the motor is assembled.

As shown in my application Ser. No. 07/765,591, now U.S. Pat. No. 5,218,860, issued Jun. 15, 1993, filed Sep. 25, 1991, the torque of a motor may be determined by attaching an encoder to the output shaft and measuring the rate of change in acceleration over a plurality of short time intervals from at or just before the application of power to the motor until the motor reaches its full speed.

In the present invention, a rotor is placed into a test fixture that includes a stator, a stationary field winding that produces a rotating magnetic field similar to that which the rotor would normally experience when ultimately installed in the motor, a flywheel and an encoder. In an automatic system, an expanding arbor would be employed to hold the rotor under test within the rotating magnetic field, and a pick and place mechanism would place each rotor onto the arbor, the test would be run, the rotor removed and the next one installed.

In a preferred embodiment of the invention, the rate of acceleration of the rotor is slowed so that the relative torque contribution of each of the cast aluminum or copper bars may be observed. This may be done by reducing the voltage applied to the stator. Further, by using an index mark on the rotor when it is installed in the test fixture, the angular position of the torque pattern can be correlated with the rotor itself. If a defective torque pattern is present in several rotors, this information may help in locating a problem in the manufacturing process.

Accordingly, it is an object of this invention to provide a method and apparatus for testing of rotors before they are installed in electric motors.

It is another object of this invention to provide a method and apparatus for testing individual rotors in order to ascertain the relative contribution of torque from each bar in the rotor.

It a further object of this invention to provide a rotor testing system where the torque contribution of individual bars in rotors can be identified by reference to an index mark place on the rotor prior to testing.

Other objects and advantages of the invention will be apparent from the following description, the accompanying drawings and the appended claims.

BRIEF DESCRIPTION OF THE DRAWINGS

FIG. 6 is an enlarged segment of a test curve similar to FIG. 5 showing the test results when testing a rotor containing a defect.

DESCRIPTION OF THE PREFERRED EMBODIMENT

Figure 1:
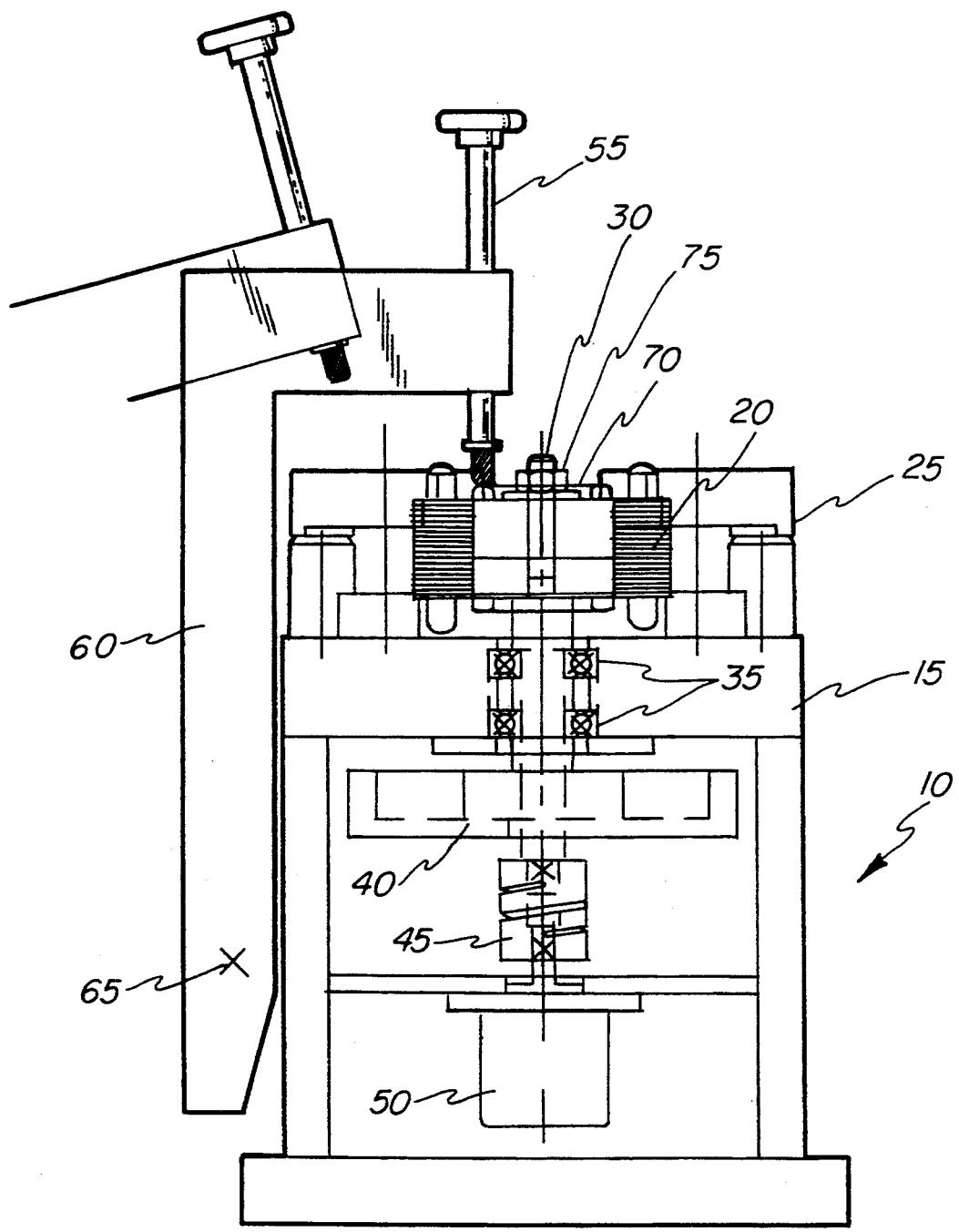
FIG. 1 is an elevational view on one embodiment of the present invention showing a rotor under test installed in a test fixture.
Figure 2:
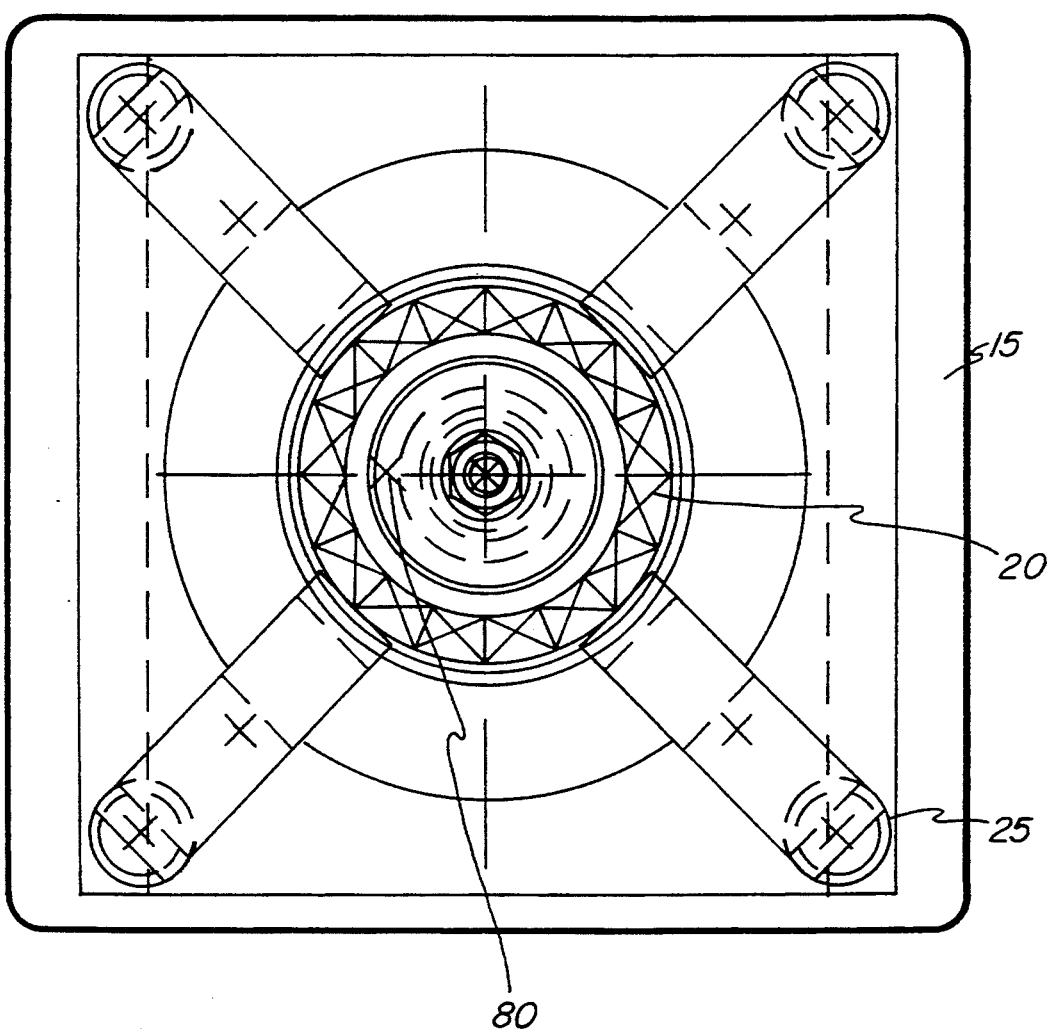
FIG. 2 is a plan view of the apparatus shown in FIG. 1.

Reference is now made to the drawings which illustrate a preferred embodiment of the invention, and particularly to FIGS. 1 and 2. A test fixture 10 is shown as including a frame 15, a stator 20, a set of clamps 25 to hold the stator 20 to the frame 15. A fixture shaft 30 is placed centrally in the frame 15 and is supported by bearings 35. The shaft carries a flywheel 40 and is connected through a misalignment coupler 45 to an encoder 50. A marking device 55 is supported by an arm 60 attached to the frame by a pivot 65, thus allowing the marking device to be moved clear of the stator 20.

As shown, a rotor 70 is installed on the fixture shaft 30 by means of a nut 75. In other embodiments of the invention, the fixture shaft 30 may include a mechanism for expanding its diameter after the rotor is place in the stator.

The stator 20 is easily replaced to accommodate rotors 70 of different diameters and electrical characteristics merely by removing the clamps 25, although one stator may be used for several different rotors provided the size difference is not too great.

The rotors 70 may be manually or automatically placed on the fixture shaft 30. After a rotor is installed, the marking device is brought into place and a start point mark 80 is placed on the rotor to show its initial angular position before the test procedure is begun.

Figure 3:
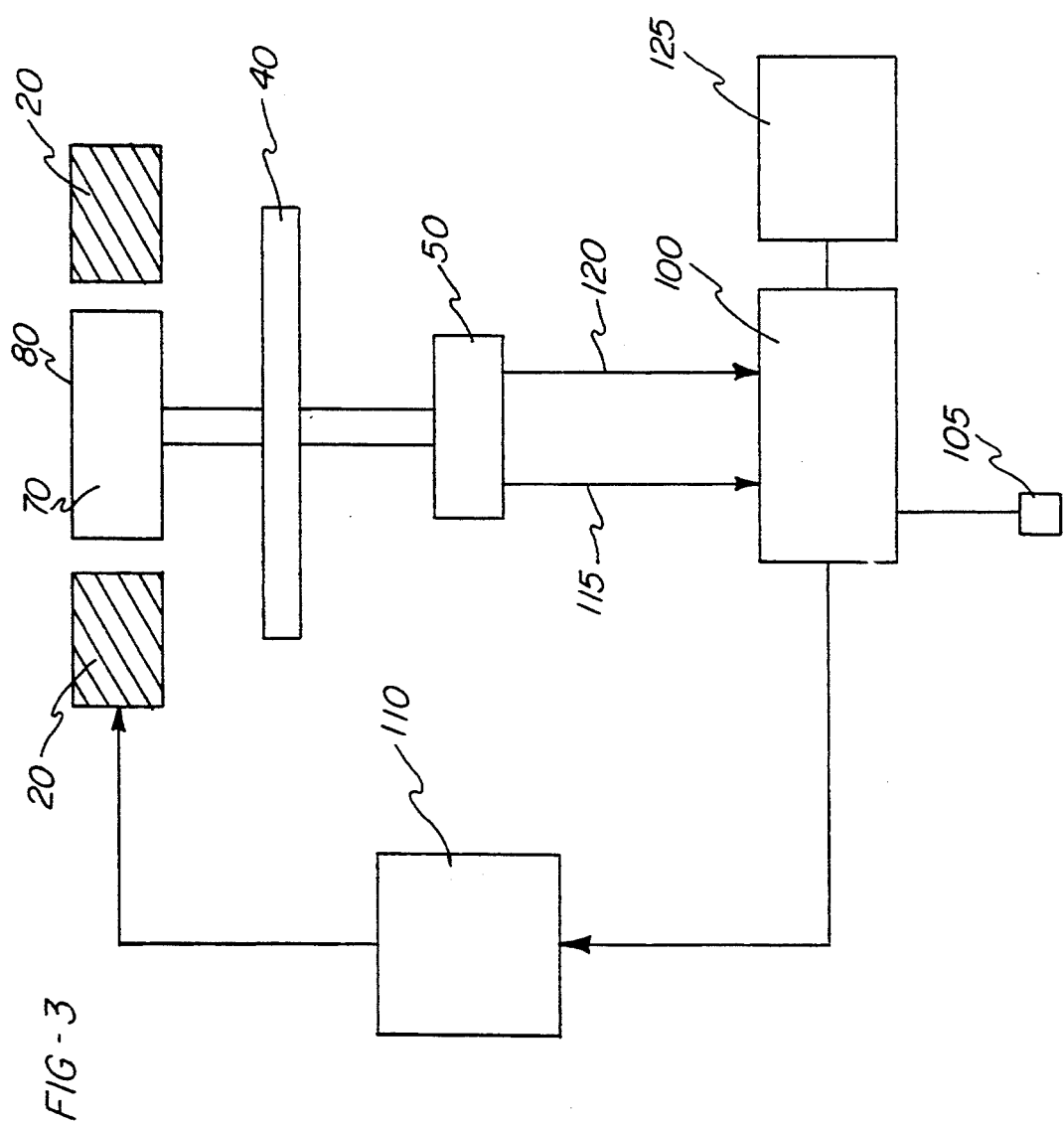
FIG. 3 is an electrical block diagram of the circuit for performing the torque test of a rotor.

Referring to the block diagram of FIG. 3, a control circuit 100 responds to the actuation of a test start switch 105 to begin the testing sequence. First, an electrical current at a lower voltage level is initially applied to the stator 20 by stator power supply 110. The rotation of the rotor 70 is monitored by the encoder 50 with an output on line 115 representing angular rotation and an output on line 120 indicating a full 360° of rotation. When the speed of the rotor has reached a predetermined angular velocity, or alternatively, after the rotor has rotated a predetermined number of times, the stator voltage may be increased. Operating the rotor test at reduced stator voltages with a large flywheel load improves the accuracy and angular resolution of the test.

In a typical $\frac{1}{3}$ to $\frac{1}{2}$ horsepower motor, the inertia of the rotor is in the order of 0.3 Oz-Ft$^2$ and the inertia of the flywheel 40 and the remainder of the system, including shaft 30, coupler 45 and encoder 50 is approximately ten times larger, although this ratio could vary considerably without departing from the scope of the invention.

As described in my U.S. Pat. No. 5,218,860, the amount of rotation in short time intervals is recorded as the rotor begins to rotate from a standstill to its full operating speed, and the amount of rotation is recorded in a memory circuit 125 for later analysis.

Figure 4:
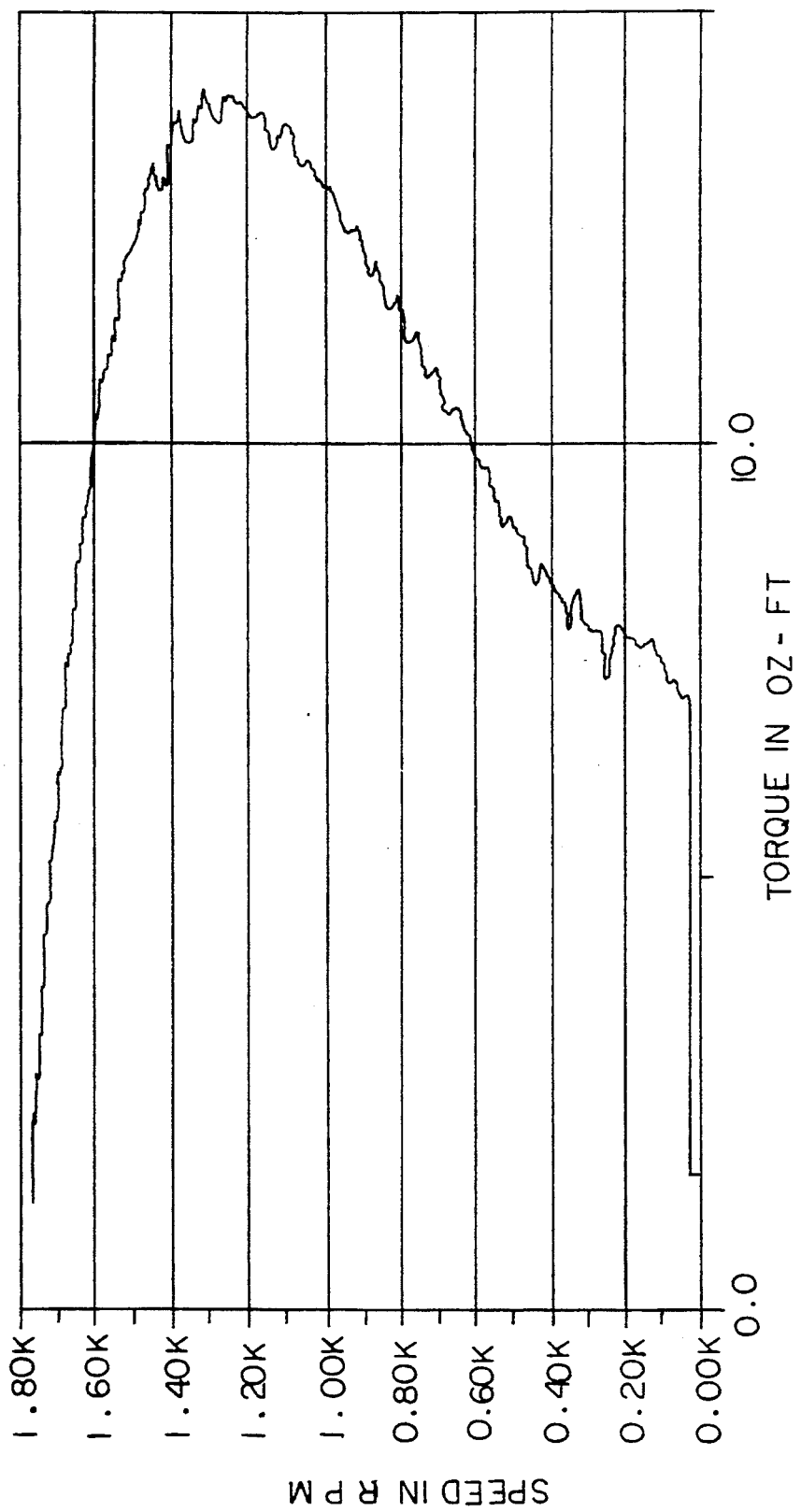
FIG. 4 is a torque vs. rotor speed test curve for a typical rotor.
Figure 5:
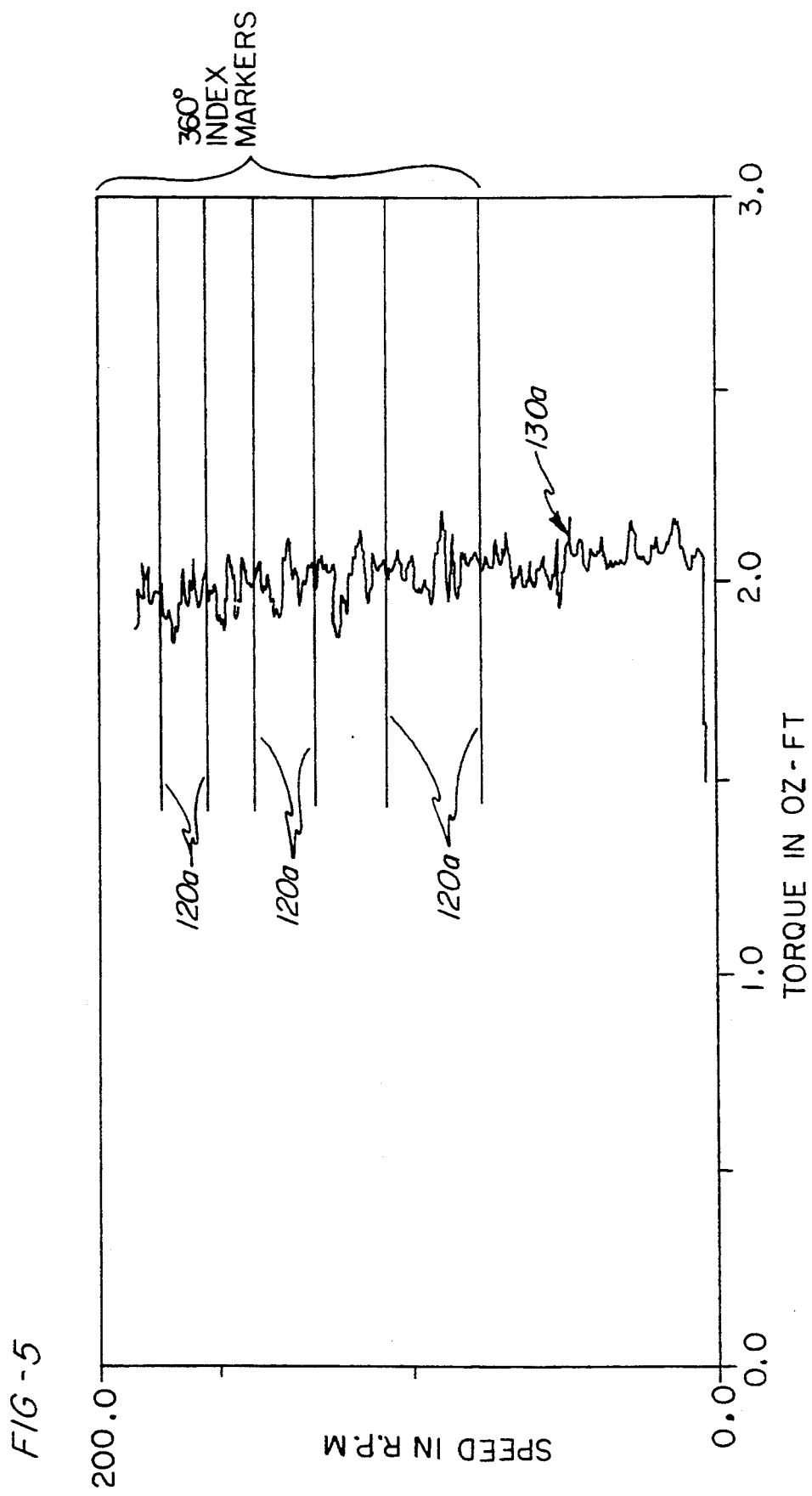
FIG. 5 is an torque vs. rotor speed test curve where the stator has been energized at lower than normal voltage.

Referring now to FIGS. 4-6, these drawings shows the relationship between torque and rotor speed (RPM). The torque recorded on these drawings are the result of calculations made from the information contained in memory 125. In these drawings, the full load torque rating for the motor in which the various rotors are used is 20 Oz-Ft, the inertia for the entire system (including rotor, flywheel and other components) is 0.3 Oz-Ft$^2$, and the sample rate is performed at a 30 Hz interval.

In FIG. 4, the stator is energized at its normal rated voltage of 120 V. This is a typical torque vs. rotor speed curve for a properly operating rotor. Of particular importance in the testing of rotors, however, is the performance of the rotor at the beginning of the test, when the rotor is accelerated from stop to a predetermined low speed of approximately 200 RPM for a rotors having a top speed of 1800 RPM. This drawing does not have the resolution necessary to reveal the characteristics of a rotor at those low speeds.

FIG. 5 shows a different rotor, but one having of the same size and characteristics as the one tested in FIG. 4. The voltage on the stator has been reduced to about 37.5% of the normal stator voltage, or to about 45 volts. The torque curve 130a shows the initial value of torque as the rotor begins to rotate from rest. The acceleration of the rotor becomes apparent by reference to the spacing of the lines 120a, which are the index signal generated by encoder 50 on line 120. While these index signals are not identical to the start point mark 80 placed on the rotor prior to the test, the angular relationship between the index and the start mark is fixed for each rotor, thus allowing for analysis of the test, and particularly the determination of the location of a defective rotor segment. Because the rotor is accelerating slowly, the variations in torque attributable to variations in rotor segments is clearly shown in this FIG. 5, which shows acceleration from zero to 200 RPM in approximately 3 seconds.

In FIG. 6, the torque vs. RPM curve of a defective rotor is shown, also tested with the stator being energized at 45 V. The spikes 135 on the torque curve 130b show a recurring pattern of reduced torque, each occurring at the same angular position with respect to index marks 120b. Thus, in this example, the location of the defective rotor segment can be ascertained rather quickly merely by reference to the torque vs. RPM curve.

While the form of apparatus herein described constitutes a preferred embodiment of this invention, it is to be understood that the invention is not limited to this precise form of apparatus and that changes may be made therein without departing from the scope of the invention, which is defined in the appended claims.

What is claimed is:

1. A method of testing electric motor bar-type rotors comprising the steps of
    providing a fixture to support a stator in which the rotating magnetic field is created,
    attaching the rotor to an inertial load of sufficient magnitude to render insignificant any variations in rotor inertia as a result of manufacturing conditions,
    creating a rotating magnetic field having a field strength less than the field strength to which the rotor will be exposed in normal operating conditions thereby to cause the rotor to accelerate slowly,
    creating an index signal for each rotation of said rotor,
    measuring the amount of rotation of the rotor at multiple, known time intervals during each revolution as the rotor accelerates through a predetermined number of revolutions, and
    calculating the torque generated by the rotor during each time interval and by reference to said index signal, determine the relative contribution to torque of each bar within the rotor under test.

2. The method of claim 1 further including the step of
    providing an index mark on the rotor under test relative to the fixture prior to beginning the test whereby the angular position of the rotor with respect to the fixture can be determined during the test.

3. The method of claim 1 further including the steps of
    thereafter creating a rotating magnetic field having a second, higher predetermined field strength approximately equal to the field strength to which the rotor will be exposed in normal operating conditions to cause the rotor to accelerate to its full operating speed,
    measuring the amount of rotation of the rotor at multiple, known time intervals as the rotor continues to accelerate, and
    calculating the torque of the rotor during each time interval as a measure of the overall quality of the rotor.

4. A testing apparatus for testing bar-type rotors of electric motors comprising
    a test fixture including
    means for temporarily connecting a rotor to a known inertial load,
    a stator for creating a rotating magnetic field to cause rotation of the rotor,
    an encoder for sensing the amount of angular rotation of the rotor, and means providing an index signal for indicating each complete revolution of the rotor, an electronic control circuit including means for applying electric current to said stator of a predetermined magnitude to create a rotating magnetic field to create initially a rotating magnetic field having a field strength less than the field strength to which the rotor will be exposed in normal operating conditions thereby to cause the rotor to accelerate slowly, means for measuring the amount of actual rotation of the rotor at multiple, known time intervals as the rotor accelerates to a predetermined speed, and means for calculating the torque of said motor with respect to said index signal thereby to provide an indication of the relative contribution to torque of each bar of said rotor.

5. The testing apparatus of claim 4 further including means for computing the torque generated by the rotor during each of said known time intervals.

6. The testing apparatus of claim 4 further including means for thereafter applying a second, higher level of electric current to said stator to cause said rotor to accelerate to its full operating speed.

7. The testing apparatus of claim 4 further including means for applying an index mark on the rotor prior to causing the rotor to rotate thereby to establish an initial angular reference of the rotor relative to said encoder.

* * * * *